United States Patent [19]
Miyake et al.

[11] Patent Number: 5,841,321
[45] Date of Patent: Nov. 24, 1998

[54] AMPLIFYING CIRCUIT USING OFFSET VALUE VARIABLE CIRCUIT

[75] Inventors: Hideki Miyake; Akira Ohmichi, both of Tokyo, Japan

[73] Assignee: Mitsubishi Denki Kabushiki Kaisha, Tokyo, Japan

[21] Appl. No.: 843,843

[22] Filed: Apr. 17, 1997

[30] Foreign Application Priority Data

Nov. 15, 1996 [JP] Japan ................................ 8-304825

[51] Int. Cl.$^6$ ........................................................ H03F 3/26
[52] U.S. Cl. .......................................... 330/255; 330/269
[58] Field of Search .............................. 330/9, 255, 264, 330/268, 269, 274; 360/67

[56] References Cited

U.S. PATENT DOCUMENTS

| | | | |
|---|---|---|---|
| 4,677,391 | 6/1987 | Kawakami | 330/269 |
| 4,888,559 | 12/1989 | Sevenhans et al. | 330/255 X |
| 5,216,382 | 6/1993 | Ito | 330/255 X |
| 5,334,950 | 8/1994 | Arimoto | 330/264 |
| 5,361,041 | 11/1994 | Lish | 330/255 |
| 5,606,281 | 2/1997 | Gloagen | 330/255 X |
| 5,652,545 | 7/1997 | Miyashita et al. | 330/269 |

FOREIGN PATENT DOCUMENTS 897645  4/1996  Japan .

*Primary Examiner*—Steven Mottola
*Attorney, Agent, or Firm*—Leydig, Voit & Mayer

[57] ABSTRACT

An amplifying circuit includes a first amplifier having a first input terminal, a second input terminal, and an output terminal for pushing an output current; a second amplifier having a first input terminal, a second input terminal, and an output terminal for pulling an output current; a circuit for detecting the output current of an operational amplifier in the second amplifier; and an offset voltage generating circuit for generating an offset voltage. In the amplifying circuit, the offset voltage is applied between the first input terminal of the first amplifier and the first input terminal of the second amplifier, the first input terminal of the first amplifier is connected to a first input signal terminal, the second input terminal of the first amplifier and the second input terminal of the second amplifier are connected to the second input signal terminal, and the output terminal of the first amplifier and the output terminal of the second amplifier are connected to each other, and the amplifying circuit supplies an output current from the connecting point. The amplifying circuit reduces the power consumption caused by the offset voltage of an operational amplifier and a relative error of the resistance value of resistors used in the circuit when no signal is input, and reduces the cross-over distortion of an output signal.

8 Claims, 12 Drawing Sheets

AMPLIFYING CIRCUIT USING OFFSET VALUE VARIABLE CIRCUIT

BACKGROUND OF THE INVENTION

1. Field of the Invention

The invention relates to an amplifying circuit which uses an MOSFET output stage and which has a capability to push and pull the output current. The present invention may be used as a voice coil motor (VCM), a driving circuit of a hard disk driver (HDD), an actuator for a CD (Compact Disc), a CD-ROM, a DVD (Digital Video Disc) and an MD (Mini Disc), and as a motor driving circuit.

2. Description of the Prior Art

As an example, a conventional amplifying circuit is used as a VCM (Voice Coil Motor) driving circuit of a HDD. FIG. 13 shows an entire construction of a conventional hard disk system. As shown in FIG. 13, the conventional amplifying circuit comprises a magnetic disk 50, a voice coil motor (VCM) 51, a magnetic head 52 mounted on a magnetic head arm 53, a spindle motor (SPM) 54 for driving the magnetic disk 50, and a VCM driving circuit 55, a register 56 for storing data necessary to control the VCM 51 and the SPM 54, a SPM driving circuit 57 for controlling the spindle motor 54, a read/write (R/W) circuit 58 for reading and writing a data from/to the magnetic head 52, and a control circuit 59 for controlling entire hard disk.

The construction of the entire hard disk is briefly explained below. Usually, the hard disk is used as a storage device in a computer, and controlled by signals from the computer. Data is recorded in the magnetic disk 50 by the magnetic head 52 via the R/W circuit 58, or read from the magnetic disk 50. The voice coil motor 51 is controlled by the VCM driving circuit 55 according to the control signal transmitted from the computer via the register 56 and according to the signal transmitted from R/W circuit 58. On the other hand, the spindle motor 54 is controlled by SPM driving circuit 57 via the control circuit 59 and register 56 according to the control signal transmitted from the computer and according to the signal from the R/W circuit 58. The present invention may be applied to the portion of the VCM driving circuit 55 in the above-mentioned hard disk construction. The SPM driving circuit 57 and the R/W circuit 58 are not directly related to the present invention, therefore the explanation thereof is omitted here.

The overview of operation of the VCM driving circuit 55 is described using FIG. 14. FIG. 14 shows, for example, a waveform of a driving voltage inputted into an input terminal of the VCM driving circuit 55. As shown in FIG. 14, when the input signal exceeds a reference electric potential, the VCM driving circuit 55 sends out a command to the voice coil motor 51 and drives the magnetic head arm 53 to move the magnetic head 52 forward. When the input signal equals to the reference electric potential, the voice coil motor 51 drives the magnetic head arm 53 to stop the magnetic head 52. When the input signal is lower than the reference electric potential, the voice coil motor 51 drives the magnetic head arm 53 to move the magnetic head 52 backward. The magnetic head arm 53 may be controlled to move in the opposite directions to the directions mentioned above. Furthermore, the waveform of the driving voltage is not necessarily a rectangular wave, but may be a sine wave.

Currently, a MOSFET is used as a power element in an output stage of the VCM driving circuit. Two points are considered as a technical background for using the MOSFET as a power element. (1) Even when the output current is large, the saturation voltage of the MOSFET is smaller than that of a bipolar transistor. (2) The power consumption of MOSFET required to drive the power element is smaller than that of a bipolar transistor. However, since the fluctuation (not only a fluctuation by a manufacturing lot, but also a fluctuation by an elapsed time) of the threshold voltage ($V_T$) between the gate electrode and the source electrode is large, the a feedback circuit constructed by an operational amplifier is used so as to reduce the influence of the fluctuation.

FIG. 15 illustrates an example of an amplifying circuit used in a conventional VCM driving circuit for the HDD which uses the MOSFET as an output stage, and utilizes a feedback constructed by the operational amplifier.

In FIG. 15, a first input terminal 1 is connected to a non-inverted input 5 of a first operational amplifier 3 and to an inverted input terminal 8 of a second operational amplifier 4. A second input terminal 2 is connected to an inverted input terminal 6 of the first operational amplifier via the resistor 9, and also connected to a non-inverted input terminal 7 of the second operational amplifier 4 via a resistor 12. An input signal 1 inputted into the input signal terminal 1 is, for example, a control voltage with a rectangular wave, such as one shown in FIG. 14, and an input signal 2 inputted into the input signal terminal 2 is a reference voltage of a constant value such as one shown in FIG. 4. These input signals 1 and 2 may be switched.

An output terminal 18 is connected to the inverted input terminal 6 of the first operational amplifier 3 via a resistor 10, and also connected to the non-inverted input terminal 7 of the second operational amplifier 4 via a resistor 13. The output terminal 18 is also connected to a source electrode of a first MOSFET 15 and to a drain electrode of a second MOSFET 16. An output of the first operational amplifier 3 is connected to a gate electrode of the first MOSFET 15, and an output of the second operational amplifier 4 is connected to a gate electrode of the second MOSFET 16. A drain electrode of the first MOSFET 15 is connected to a power supply 17. A resistor 11 is connected between the gate and the source electrodes of the first MOSFET 15, and a resistor 14 is connected between the gate and the source electrodes of the second MOSFET 16. The resistors 11 and 14 prevent a drain current from flowing through the first MOSFET 15 and the second MOSFET 16 based on the charge left in the gate electrodes of the MOSFETs 15 and 16 at the time of no signal input. However, the resistors 11 and 14 may be omitted here. A first amplifier 25 is a circuit comprising the first operational amplifier 3 and the first MOSFET 15. A second amplifier 26 is a circuit including the second operational amplifier 4 and the second MOSFET 16. An amplifying circuit pair 55 is constructed from the first amplifier 25 and the second amplifier 26.

The operation of the amplifying circuit pair 55 of FIG. 15 is explained below. In FIG. 15, the first amplifier 25 and the second amplifier 26 are inputted with an input signal such as one shown in FIG. 14, and operate as push-pull amplifiers. When the reference voltage is received from an output terminal 60 and the input signal exceeds the reference voltage as shown in FIG. 14, the first amplifier 25 operates so that the first MOSFET 15 discharges a current to a load 29 as a push amplifier. When the input signal is smaller than the reference voltage as shown in FIG. 14, the second amplifier 26 operates so that the second MOSFET 16 pulls a current from the load 19 as a pull amplifier. When the input signal equals to the reference voltage, neither the first amplifier 25 nor the second amplifier 26 operate, and any current does not flow through the load 29.

When a current flows from the MOSFET 15 into the load 29, the source electrode of the first MOSFET 15 operates as a current output terminal, and when a current flows to the MOSFET 15 in from the load 29, the drain of the second MOSFET 16 operates as a current output terminal. The source electrode of the first MOSFET 15 and the drain electrode of the second MOSFET 16 are connected, and the voltage is $v_0$. Assuming that the source voltage of the first MOSFET 15 is $v_{01}$ and the drain voltage of the second MOSFET 16 is $v_{02}$, prior to connecting the source electrode of the first MOSFET 15 with the drain electrode of the second MOSFET 16, the following formulas are obtained.

$$v_{O1} = (1 + R_5/R_4)v_1 - (R_5/R_4)v_2 \tag{1}$$

$$v_{O2} = (1 + R_8/R_7)v_1 - (R_8/R_7)v_2 \tag{2}$$

The output voltage is determined by the voltages of the input signal terminals 1 and 2 where, $v_1$ is the voltage of the input signal terminal 1, $v_2$ is the voltage of the input signal 2 and the resistance values of the resistors 9, 10, 12, and 13 are $R_4$, $R_5$, $R_7$ and $R_8$ respectively. In the formulas (1) and (2), the resistance value is usually set to be $R_4=R_7$ and $R_5=R_8$, and ideally, $V_{O1}=V_{O2}$ is obtained, therefore any current does not flow between the source electrode of the first MOSFET 15 and the drain of the second MOSFET 16.

However, in reality, because of relative errors of resistance values of the resistors 9, 10, 12 and 13 and offset voltages of the operational amplifiers 3 and 4, $v_{O1}$ and $v_{O2}$ do not become equal. If $v_{O1}=v_{O2}$ were established in reality, in other words the input signal voltage and the reference voltage were equal (at the time of no input signal), a current should not flow between the source electrode of the first MOSFET 15 and the drain electrode of the second MOSFET 16. However, if $v_{O1}=v_{O2}$ is not established, a current starts flowing between the source electrode of the first MOSFET 15 and the drain electrode of the second MOSFET 16.

In FIG. 15, for example, assuming that the input signal voltage $v_1$ and the input signal $v_2$ are both 2 V, the resistance values $R_4=R_7=1K\Omega$, $R_5=2K\Omega$, $R_8$ is 2.1K$\Omega$, deviated from 2K$\Omega$ by 5%, and the non-inverted input of the second operational amplifier 4 is 1.99 V, because of 10 mV offset, the output voltage ($v_{O1}$) of the first amplifier 25 is 2 V, and the output voltage ($v_{O2}$) of the second amplifier 26 is 1.969 V from the formulas (1) and (2). Therefore, a current flows from the source electrode of the first MOSFET 15 to the drain electrode of the second MOSFET 16. Accordingly, there have been problems that the power consumption of the amplifying circuit pair 55 and the below-explained cross-over distortion become larger at the time of no signal input, as explained below. In addition, this cross-over distortion is a phenomenon which occurs when the first MOSFET 15 changes from on to off, and when the second MOSFET 16 changes from off to on. (see FIG. 8)

SUMMARY OF THE INVENTION

It is an object of the present invention to reduce the power consumption in the above amplifying circuit by the relative error of the resistance value or an offset voltage of an operational amplifier.

It is another object of the present invention to reduce a cross-over distortion of an output signal.

According to one aspect of the invention, an amplifying circuit comprises: a first amplifier having a first input terminal, a second input terminal and an output terminal for pushing an output current; a second amplifier having a first input terminal, a second terminal and an output terminal for pulling an output current; a circuit for detecting the output current of an operational amplifier in the second amplifier; and an offset voltage generating circuit for generating a predetermined offset voltage.

In an amplifying circuit, the offset voltage is applied between the first input terminal of the first amplifier and the first input terminal of the second amplifier, the first input terminal of the first amplifier is connected to a first input signal terminal, the second input terminals of the first amplifier and the second input terminals of the second amplifier are connected to the second input signal terminal, and the output terminal of the first amplifier and the output terminal of the second amplifier are connected to each other, and the amplifying circuit supplies an output current from the connecting point.

According to another aspect of the invention, an amplifying circuit having two sets of amplifying circuits, wherein a load is connected between the output terminal of the first amplifying circuit and the output terminal of the second amplifying circuit, the first input terminal of the first amplifying circuit is connected to the first input terminal of the second amplifying circuit, and further the second input terminal of the first amplifying circuit is connected to the second input terminal of the second amplifying circuit, so that the output current flowing through the load is pushed and pulled.

According to further aspect of the invention, an amplifying circuit, wherein the first offset value variable circuit and the second offset value variable circuit have an offset resistor, respectively, and one end of the offset resistor is connected to a power supply via a first constant current supply whose other end is grounded, and to a power supply via a switch, which is controlled by the signal output from the comparator, and a third constant power supply, and further to an inverted input terminal of the second operational amplifier, and the other end of the offset resistor is connected to the first input signal terminal and one end of the second constant current supply whose other end is grounded, and to a non-inverted input terminal of the first operational amplifier.

According to still further aspect of the invention, an amplifying circuit, wherein the first and second offset value variable circuits have an offset resistor, respectively, and one end of the offset resistor is connected to a power supply via a first constant current supply whose other end is grounded, and is grounded via a switch, which is controlled by a signal from the comparator, and a third constant current supply whose one end is connected in series to the switch and whose other end is grounded, and further to the inverted input terminal of the second operational amplifier, and the other end of the offset resistor is connected to the first input signal and to one end of the second constant current supply whose other end is grounded, and further to the non-inverted input terminal of the first operational amplifier.

DETAILED DESCRIPTION OF THE PREFERRED EMBODIMENTS

Embodiment 1

Figure 1:
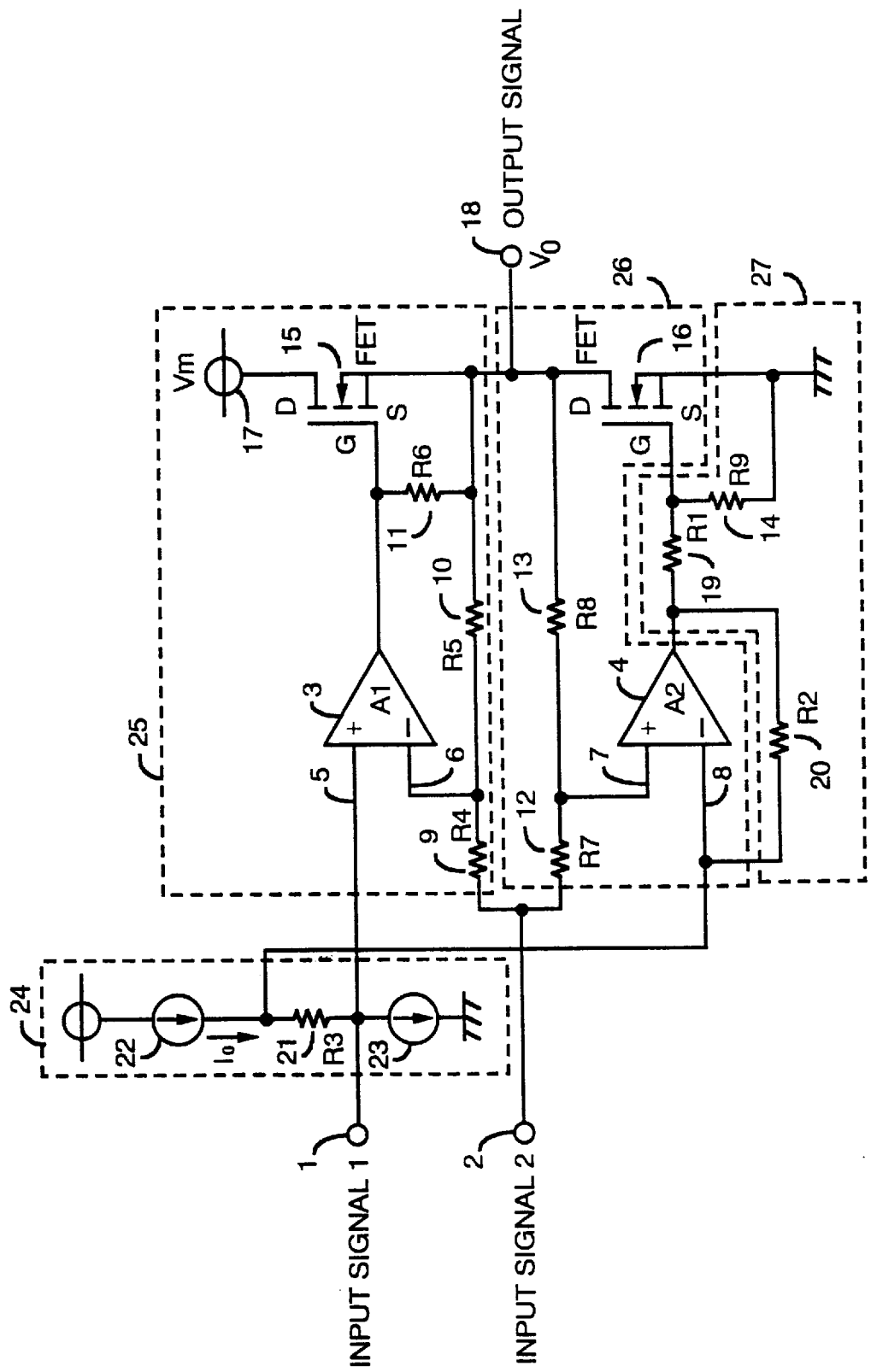
FIG. 1 shows an amplifying circuit according to a first embodiment of the present invention.
Figure 15:
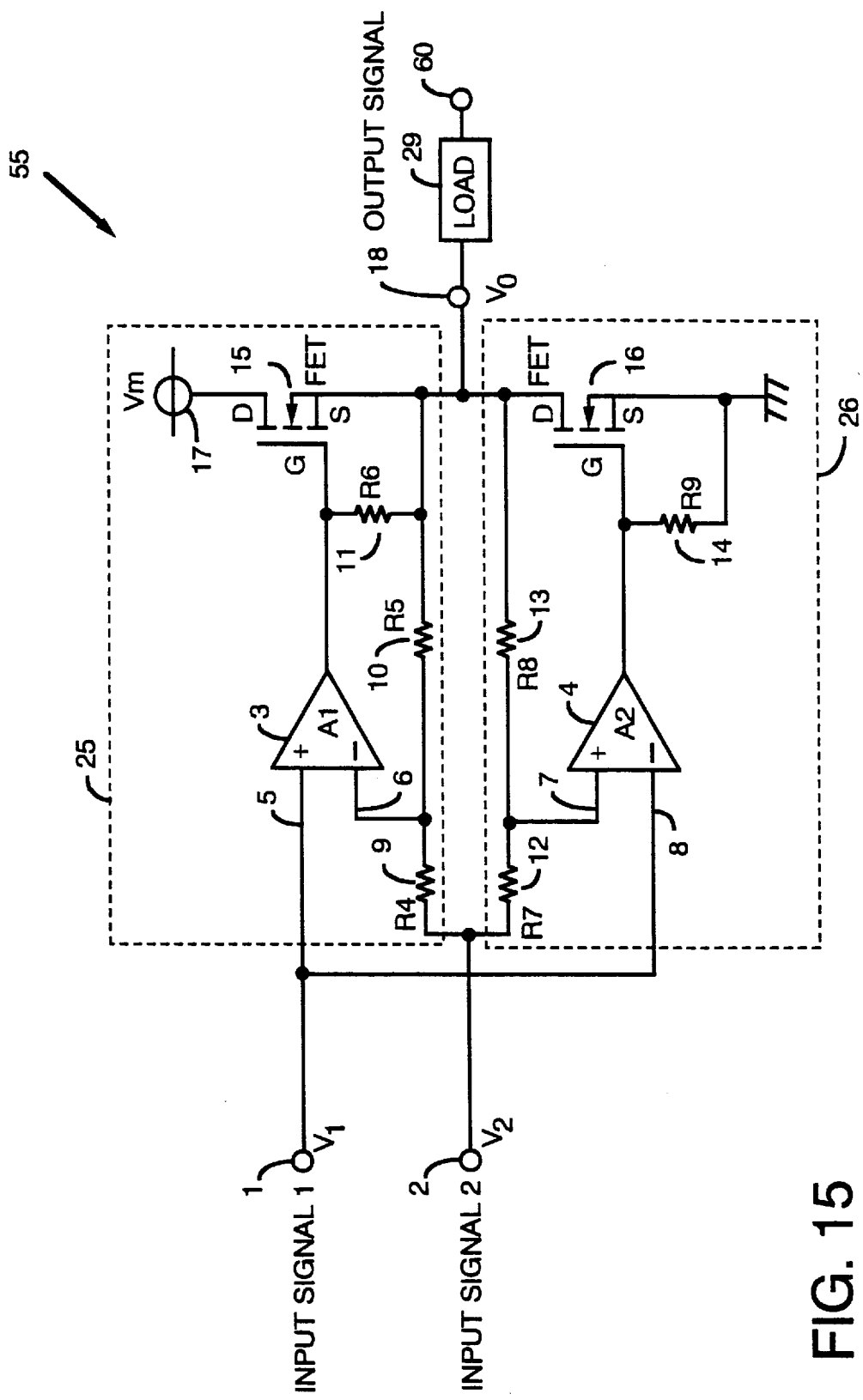
FIG. 15 shows one example of a conventional amplifying circuit pair using a MOSFET as an output stage.

FIG. 1 shows an amplifying circuit according to a first embodiment of the present invention. The amplifying circuit according to the first embodiment comprises an offset voltage generating circuit 24 including constant current supplies 22, 23, an offset resistor 21, and an output current detecting circuit 27 including resistors 19 and 20 for detecting the output current of the second operational amplifier 4 and performing feedback, in addition to the conventional amplifying circuit of FIG. 15.

One end of the offset resistor 21 is connected to the constant current supply 22 and to the inverting input terminal 8 of the second operational amplifier 4, and the other end is connected to the input signal terminal 1, the constant current supply 23 and the non-inverting input terminal of the first operational amplifier 3. The resistor 20 is connected between the inverting input terminal 8 of the second operational amplifier 4 and to the output terminal of the second operational amplifier 4.

Figure 2:
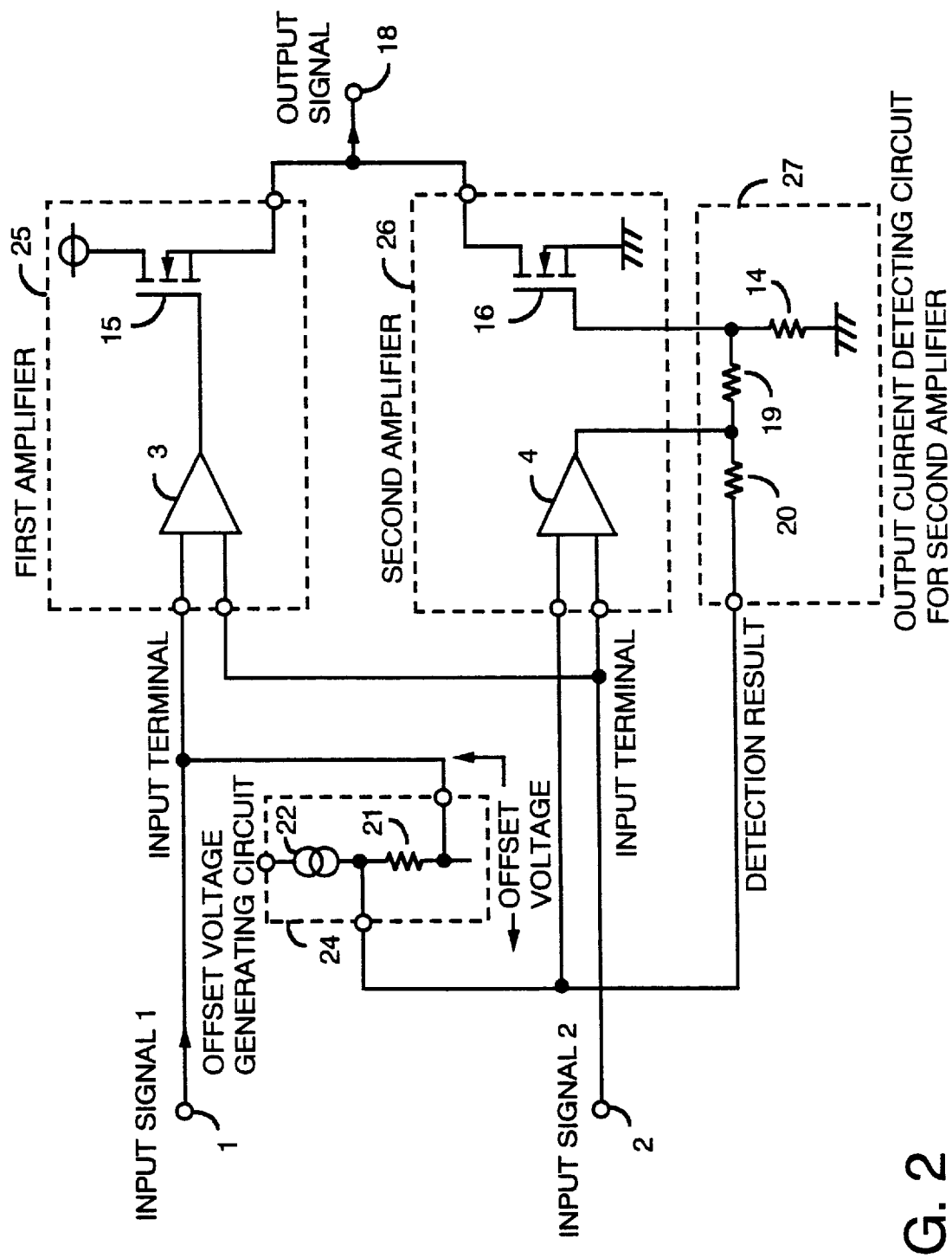
FIG. 2 shows the location of a first operational amplifier, a second operational amplifier, an offset voltage generating circuit, and resistors 19, 20 of FIG. 1.

FIG. 2 shows a location of the output current detecting circuit 27 comprising the offset voltage generating circuit 24, and resistors 19 and 20 of FIG. 1. Elements such as the resistors in the first amplifier 25 and in the second amplifier 26 are omitted in FIG. 2.

Figure 3:
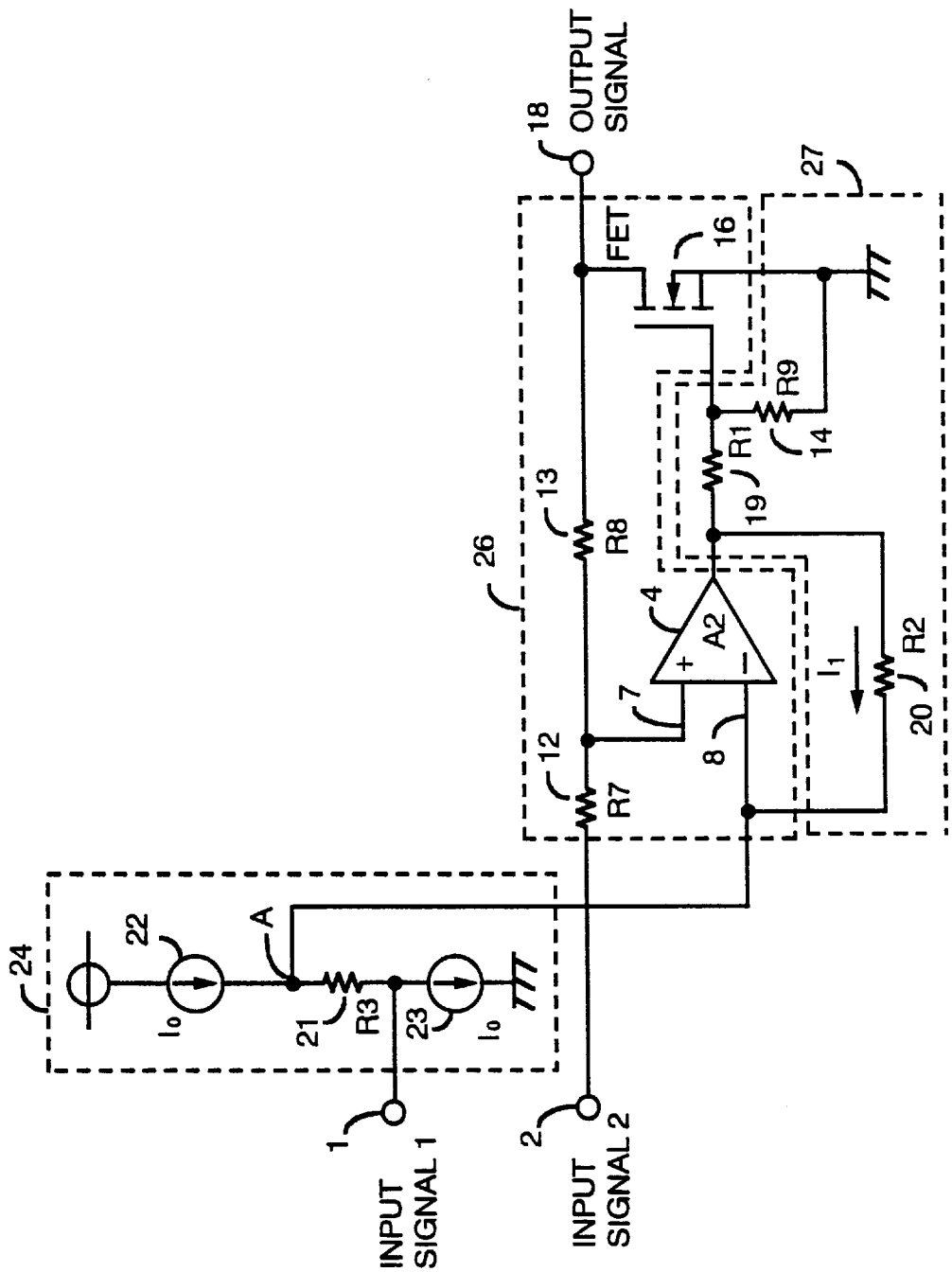
FIG. 3 shows the location of the offset generating circuit, the second operational amplifier, and an output voltage detecting circuit of FIG. 1.

Furthermore, FIG. 3 shows a location of the offset voltage generating circuit 24, the second amplifier 26, and the output current detecting circuit 27 of FIG. 1. The first amplifier 25 of FIG. 1 is omitted in FIG. 3.

An operation of the amplifying circuit according to the first embodiment is explained below using FIG. 3, in case where the drain voltage of the second MOSFET 16 is lower than the source voltage of the first MOSFET 15 under the influence of the relative error of the resistance value and the offset voltage of the operational amplifier.

The output voltage of the second amplifier 26 becomes lower than the output voltage of the first amplifier 25 because of the offset of the input voltage of the second amplifier 26. In order to improve the condition, the offset voltage is generated by the offset voltage generating circuit 24, then the generated offset voltage is applied to the non-inverting input terminal of the second amplifier 26, which increases the output voltage of the second amplifier 26. In FIG. 3, assuming that the current flowing through the constant current supplies 22 and 23 is $I_0$, the voltage drop of the offset resistor 21 becomes $I_0R_3$. Therefore, the voltage inputted into the inverting input terminal of the second operational amplifier 4 exceeds the voltage inputted to the non-inverting input terminal of the first operational amplifier 3 by the voltage drop amount $I_0R_3$. Thus, the output voltage $V_{O2}$ of the second amplifier 26 becomes higher than the normal output voltage by $(1+R_8/R_7) \times R_3I_0$. Therefore, the unnecessary current flowing from the source electrode of the first MOSFET 15 to the drain electrode of the second MOSFET 16 in the amplifying circuit at the time of no signal input can be suppressed, and the increase of the power consumption at the time of no signal input can be prevented.

The above mentioned $(1+R_8/R_7) \times I_0R_3$ is obtained by the calculations below. In the above-mentioned formula (2), $$v_{02}=(1+R_8/R_7)v_1-(R_8/R_7)v_2 \qquad (2)$$

if the voltage after $v_1$ rises by $I_0R_3$ is $v_1$, $v_1'=v_1+I_0R_3$ is obtained. If this $v_1'$ is substituted for $v_1$ of the formula (2), the output voltage $v_{02}'$ of the second amplifier 26 is as follows.

$$\begin{aligned} v_{02}' &= (1+R_8/R_7)(v_1+I_0R_3)-(R_8/R_7)v_2 \\ &= (1+R_8/R_7)v_1-(R_8/R_7)v_2+(1+R_8/R_7) \times I_0R_3 \\ &= v_{02}+(1+R_8/R_7) \times I_0R_3 \end{aligned}$$

As explained above, when the output voltage of the second amplifier 26 becomes lower than the output voltage of the first amplifier 25, a current flows from the source electrode of the first MOSFET 15 to the drain electrode of the second MOSFET 16. At this time, the voltage of the inverted input terminal of the second operational amplifier 4 lowers, and the voltage between the gate and the source electrodes of the second MOSFET 16 rises. If the current $I_1$ flowing the resistor 20 flows in the direction shown by an arrow, this current flows to the input signal terminal 1 via the offset resistor 21, which raises the voltage of one end A of the offset resistor 21. The voltage at this point A is applied to the inverted input terminal 8 of the second operational amplifier 4. Therefore, the voltage of the inverted input terminal 8 which had been low prior to this time rises, and the output voltage at the output terminal 18 of the second amplifier 26 also rises.

Accordingly, the power flowing between the source electrode of the first MOSFET 15 and the drain electrode of the second MOSFET 16 decreases. In this manner, when the output terminal 8 of the voltage of the second amplifier 26 decreases according to the relative error of the resistance values R7, R8 and the offset of the second operational amplifier 4, a feedback is applied in a direction that decreases the drain current of the second MOSFET 16. In this manner, in the first embodiment, it is possible to prevent the increase of the power consumption at the time of no signal input caused by the increase of the drain current of the second MOSFET 16.

Embodiment 2

Figure 4:
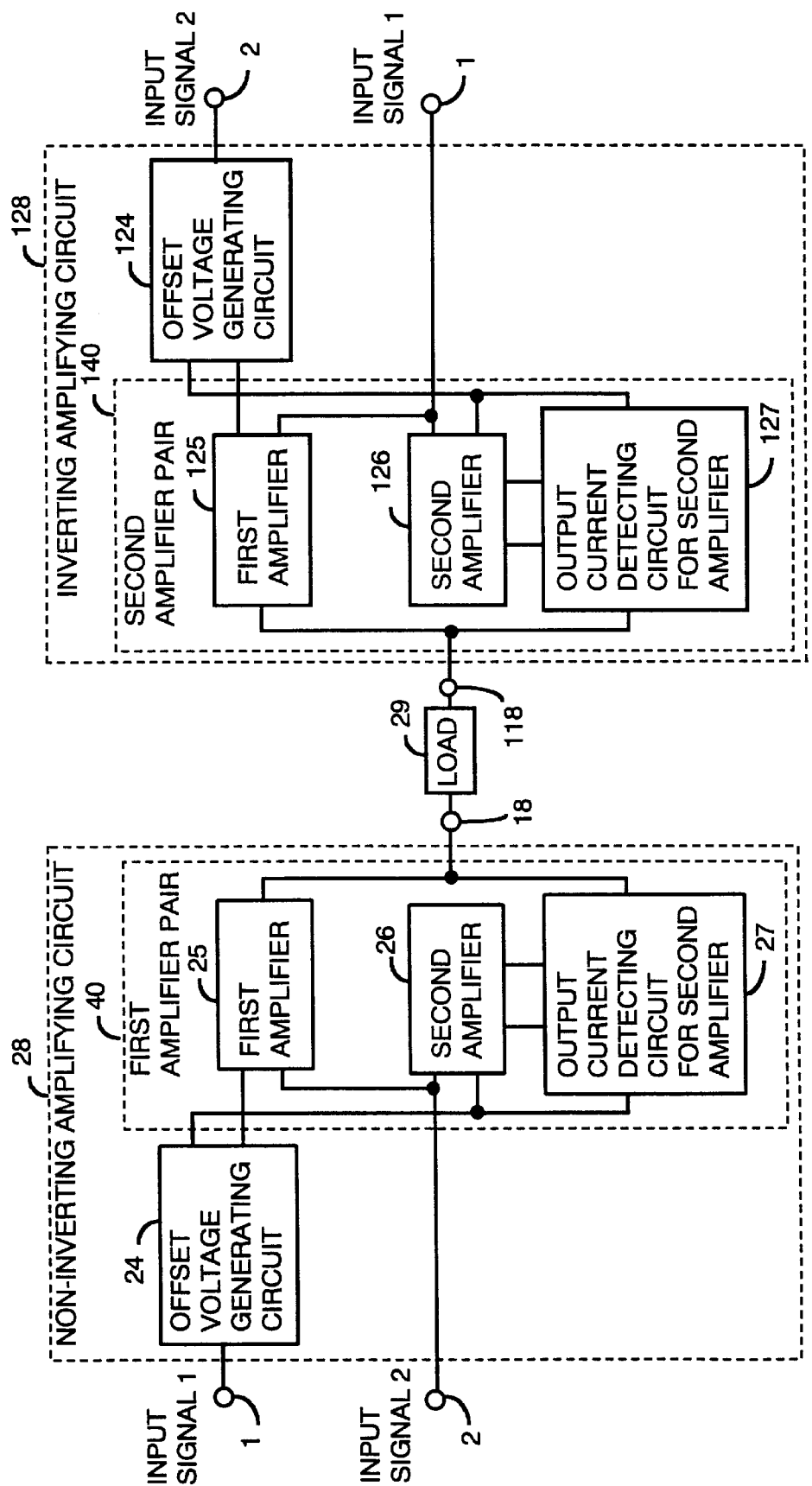
FIG. 4 shows an amplifying circuit according to a second embodiment of the present invention.

FIG. 4 is a block diagram showing an amplifying circuit according to a second embodiment of the present invention. In this embodiment, two of the amplifying circuits according to the first embodiment are used, and their respective output terminals are connected via the load 29. The load 29 is driven by a differential output. The amplifying circuits of FIG. 4 comprises a non-inverted amplifying circuit 28 and an inverted amplifying circuit 128, which provide a current to the load 29. The non-inverted amplifying circuit 28 is the same as the circuit of either FIG. 1 or FIG. 2 according to the first embodiment. An input signal is inputted to the input signal terminal 1, and a reference voltage is inputted to the input signal terminal 2. On the other hand, the inverted amplifying circuit 128 is the same as the circuit of either FIG. 1 or FIG. 2 according to the first embodiment. However, the inverted amplifying circuit 128 is different from the non-inverted amplifying circuit 28 because the input signal terminal 1 and the input signal terminal 2 are switched, thus an input signal is inputted to the input signal terminal 1, and a reference voltage is inputted to the input signal terminal 2. An amplifier pair 40 includes the first amplifier 25 and the second amplifier 26, and an amplifier pair 140 includes the first amplifier 125 and the second amplifier 126.

Figure 5:
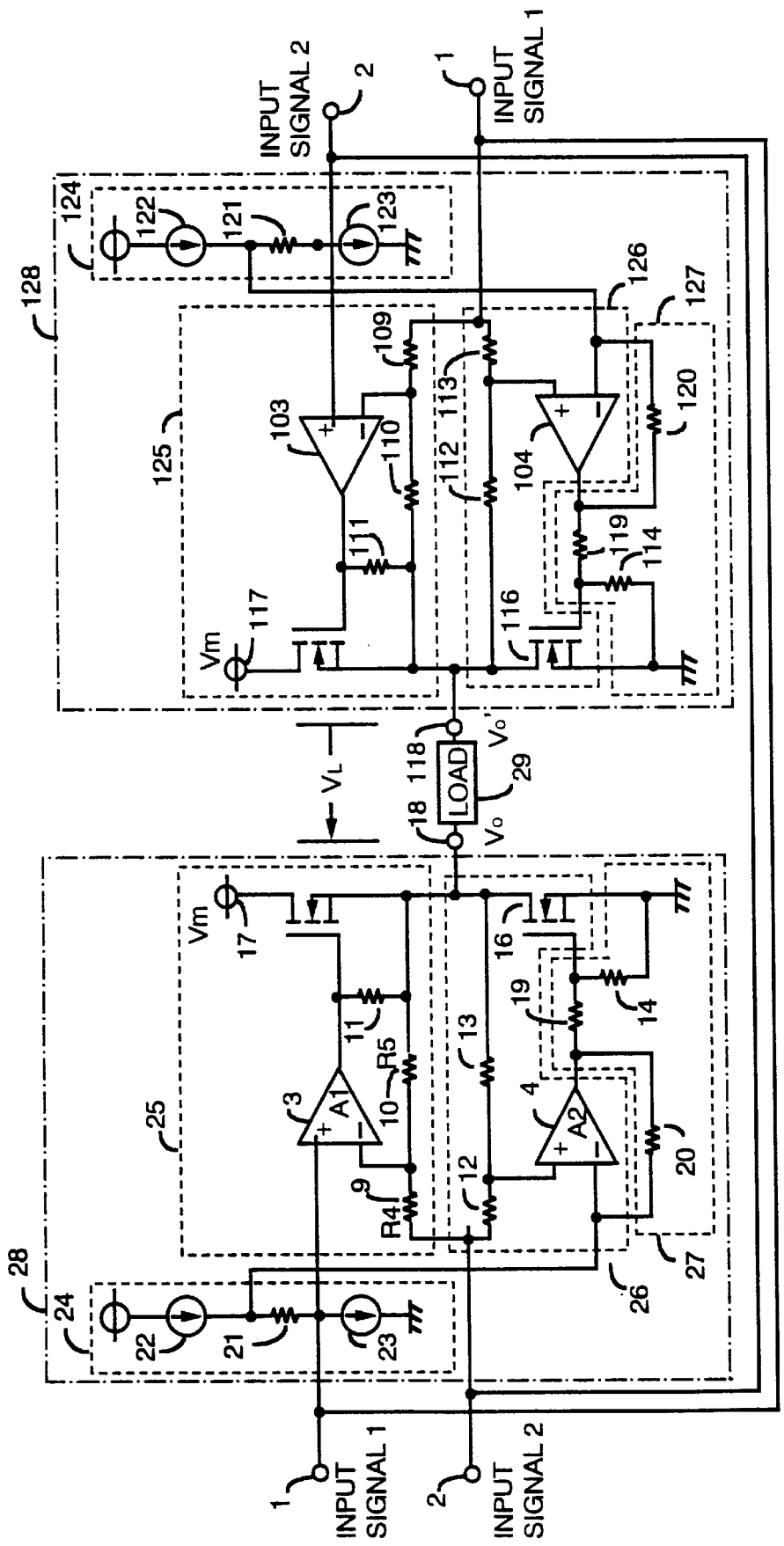
FIG. 5 shows a specific circuit of FIG. 4.

FIG. 5 shows a specific circuit of FIG. 4. Because the connections of the circuit in FIG. 5 are the same as those of FIG. 2, the explanation is omitted here. In FIG. 5, assuming that the voltage of the output terminal 18 of the non-inverted amplifying circuit 28 is $v_0$, the voltage of the output terminal 118 of the inverted amplifying circuit 128 is $v_0'$, the resistance value of the resistors 9 and 109 is $R_4$, the resistance value of the resistors 10 and 110 is $R_5$, the voltage applied to the input signal terminal 1 of the non-inverted amplifying circuit 28 and the voltage applied to the input signal terminal 1 of the inverted amplifying circuit 128 is $v_1$, and the reference voltage applied to the input signal terminals 2 of the non-inverted amplifying circuit 28 and the reference voltage applied to the input signal terminals 2 of the inverted amplifying circuit 128 is $v_2$, the voltage $V_L$ between the terminals of the load 29 is calculated as follows.

$$v_L = v_0 - v_0' = (1 + 2 R_5/R_4)(v_1 - v_2) \quad (3)$$

When $v_L > 0$, since the MOSFET 15 at the output stage of the non-inverted amplifying circuit 28 pushes the output current, and the MOSFET 116 at the output stage of the inverted amplifying circuit 128 pulls the output current, the current flowing through the load 29 flows in the direction from the output terminal 18 toward the output terminal 118. Also when $v_L < 0$, since the MOSFET 115 at the output stage of the inverted circuit 128 pushes the output current, and the MOSFET 16 at the output stage of the non-inverted amplifying circuit 28 pulls the output current, the current flowing through the load 29 flows in the direction from the output terminal 118 toward the output terminal 18. As explained above, in this embodiment, the load connected to the both output terminals can be driven by push-pull condition.

The principle preventing the power consumption from increasing at the time of no signal input is the same as that of the first embodiment, therefore, the explanation is omitted here. In addition, the operation preventing the power consumption from increasing at the time of no signal input takes place in the non-inverted amplifying circuit 28 and the inverted amplifying circuit 128 respectively.

Embodiment 3

Figure 6:
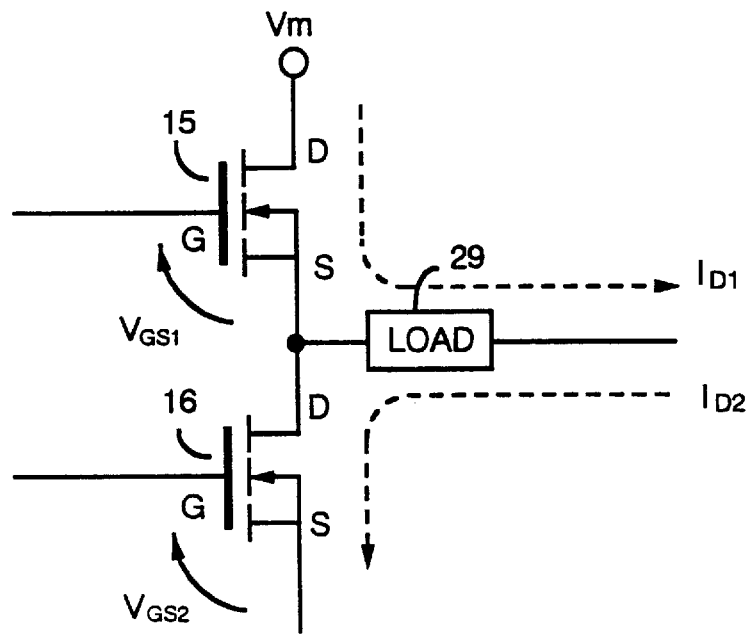
FIG. 6 shows a first MOSFET, a second MOSFET and a load of FIG. 5.
Figure 7:
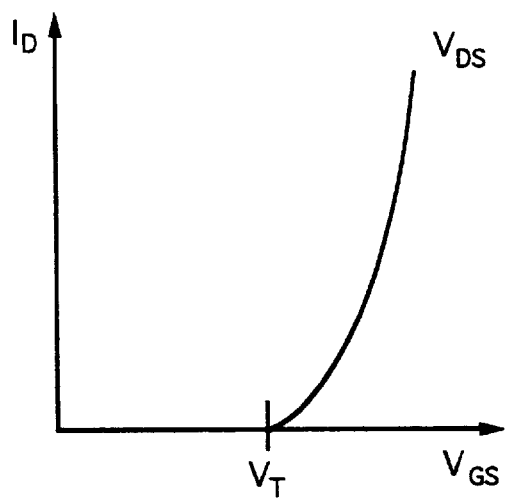
FIG. 7 shows the relationship between the voltage $V_{GS}$ between the gate and the source electrodes of an FET and the drain current ID.
Figure 8:
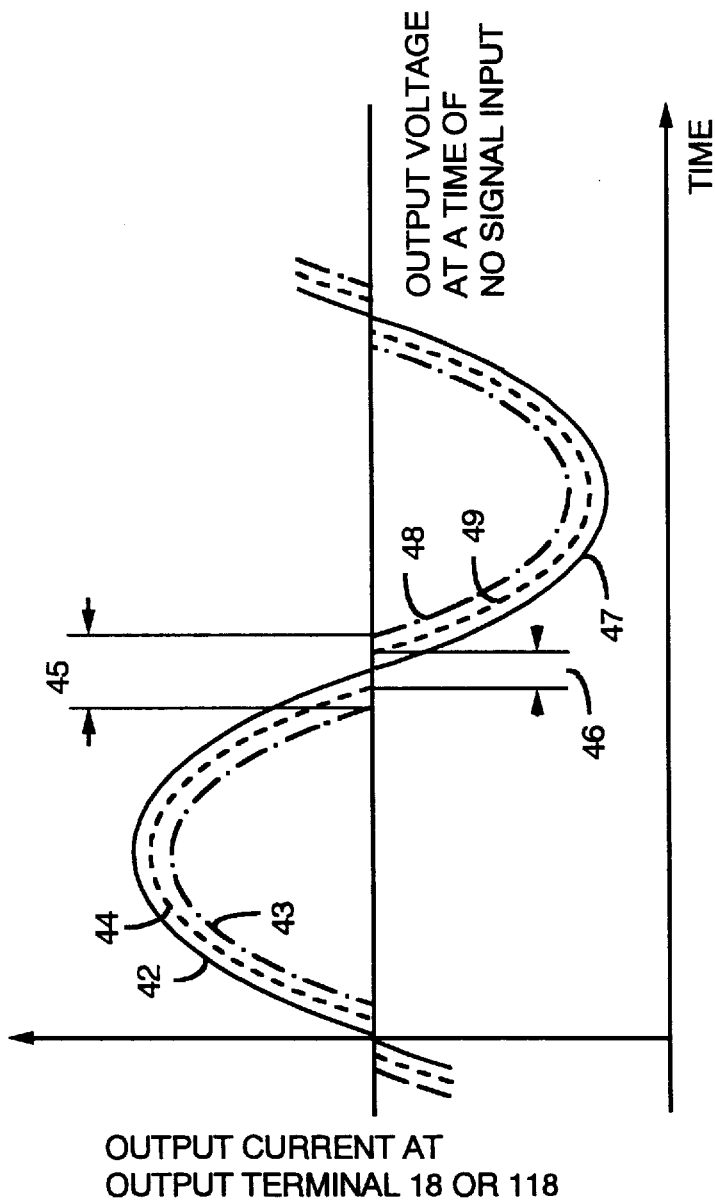
FIG. 8 shows current waveforms according to the second and the third embodiment of the present invention.

Firstly, a cross-over distortion, which occurs in the amplifying circuits of the second embodiment shown in FIG. 5, is explained below. FIG. 6 specifically illustrates the first MOSFET 15, the second MOSFET 16 and the load 29 in FIG. 5. FIG. 7 illustrates the relationship between the voltage $V_{GS}$, which is the voltage between the gate and the source of a FET, and the drain current $I_D$. FIG. 7 shows that until the voltage $V_{GS}$ between the gate and the source electrodes of FET exceeds the threshold voltage $V_T$, the drain current $I_D$ does not flow. FIG. 8 shows the ideal output voltage waveforms 42 and 47 according to the second embodiment (FIG. 5) and the third embodiment (FIG. 10), the output current waveforms 43 and 48 according to the second embodiment, and the output voltage waveforms 44 and 49 according to the third embodiment.

In FIG. 6, when the first MOSFET 15 is ON, the current $I_{D1}$ flows in the direction from the first MOSFET 15 to the load 29. On the other hand, when the second MOSFET 16 is ON, the current $I_{D2}$ flows in the direction from the load 29 to the second MOSFET 16. These currents $I_{D1}$ and $I_{D2}$ do not flow until $V_{GS}$ exceeds the threshold voltage $V_T$ as shown in above-mentioned FIG. 7. Therefore, the drain current $I_{D1}$ flowing through the first MOSFET 15 has the waveform shown with the chain line 43 in FIG. 8. On the other hand, the drain current $I_{D2}$ has the waveform shown with chain line 48 in FIG. 8. As shown in FIG. 8, when the current is inverted, a range where the current does not flow occurs. This is generally called a cross-over distortion 45. When this cross-over distortion 45 occurs, a discontinuity occurs in the current waveform which causes distortion of the current waveform. Therefore, this cross-over distortion 45 should be reduced to the minimum. The third embodiment provides a circuit for reducing this cross-over distortion 45.

Figure 9:
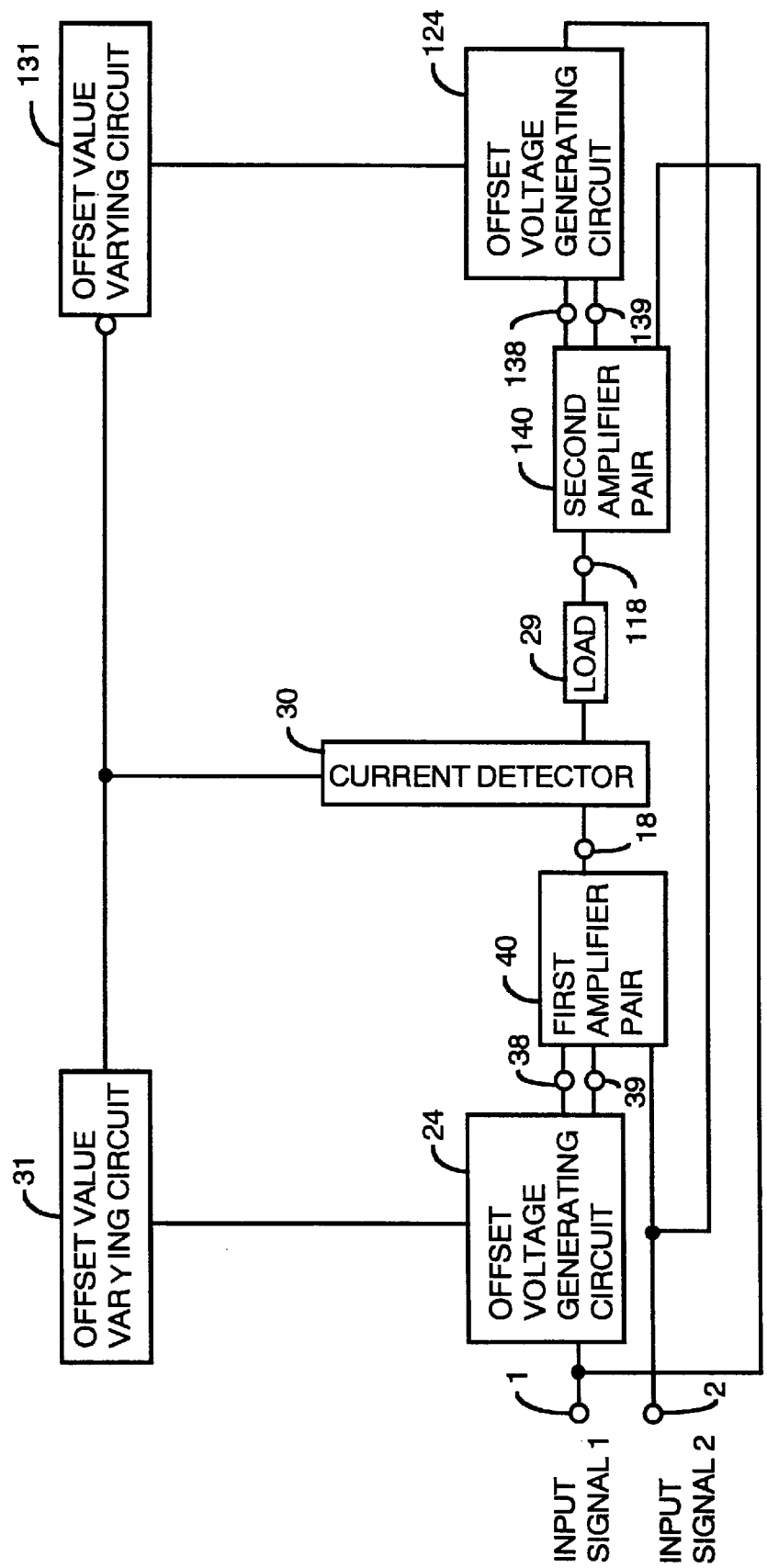
FIG. 9 is a block diagram showing the construction of an amplifying circuit according to a third embodiment of the present invention.

FIG. 9 shows an amplifying circuit according to a third embodiment of the present invention. In FIG. 9, the portions which comprise the offset voltage generating circuit 24, the first amplifier pair 40, the load 29, the second amplifier pair 140, and the offset voltage generating circuit 124 are same as those of FIG. 4. In FIG. 9, a current detector 30 for detecting the current flowing through the load 29, and offset value variable circuits 31 and 132 for switching the offset voltages generated in the offset voltage generating circuits 24 and 124 are added to the circuit of FIG. 5, which is different from the second embodiment. The circuit according to this third embodiment reduces the cross-over distortion of the output waveform.

Figure 10:
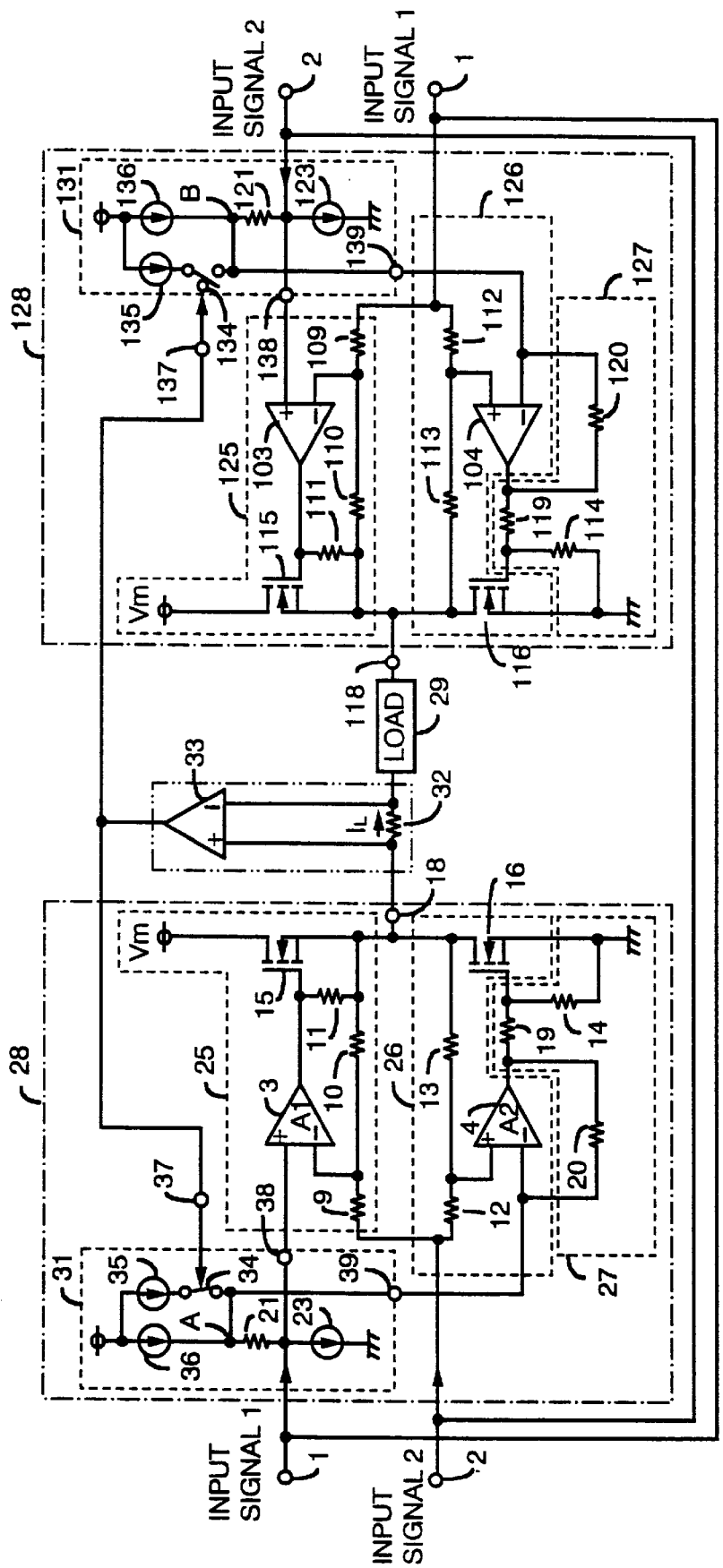
FIG. 10 shows one example of the amplifying circuit according to the third embodiment of the present invention.

A circuit for reducing the cross-over distortion is explained below. FIG. 10 shows a detailed circuit of FIG. 9. In FIG. 10, the series resistor 32 detects the direction of the current flowing through the load 29. The offset value varying circuits 31 and 131 are the same as those of FIG. 9. A constant voltage circuit 35 and a switch 34 are added to the offset voltage generating circuit 24 of FIG. 5 to form an offset value variable circuit 31. That is, in the offset value variable circuit 31, one end of the offset resistor 21 (point A) is connected to the constant current supply 36 and a terminal 39. The terminal 39 is connected to the inverted input terminal of the second operational amplifier 4. The other end of the offset resistor 21 is connected to the input signal terminal 1, the constant current supply 23 and to a terminal 38. The terminal 38 is connected to the non-inverted input terminal of the first operational amplifier 3. The terminal on the voltage side of the constant current supply 36 is connected to one end of the constant current supply 35, and the other end of the constant current supply 35 is connected to the point A via a switch 34.

On the other hand, in the offset value varying circuit 131, one end of the offset resistor 121 (point B) is connected to a constant current 136 and a terminal 139. The terminal 139 is connected to the inverted input terminal of a second operational amplifier 104. The other end of the offset resistor 121 is connected to the input signal terminal 2, a constant current supply 123 and to a terminal 138. The terminal 138 is connected to the non-inverted input terminal of the first operational amplifier 103. The terminal on the power supply side of the constant current supply 136 is connected to one end of a constant current supply 135, and the other end of the current supply 135 is connected to the point B via a switch 134.

The inverted input terminal and the non-inverted input terminal of a comparator 33 are connected to the both ends of the series resistor 32, and the comparator 33 detects the direction of the current flowing through the load 29. When the output current $I_L$ is flowing from the output terminal 18 to the output terminal 118, the comparator 33 outputs a voltage, for instance, the logic "H", which turns the switch 34 ON and turns the switch 134 OFF. Since the switch 34 turns on, both currents from the constant current supplies 36 and 35 flow into the offset resistor 21, the offset voltage generated in the resistor 21 rises higher than that of when the switch 34 is off.

The negative logic switch 134 turns off when the comparator 33 outputs logic "H". At this time, since the current flowing through the resistor 121 is only from the constant power supply 136, the offset voltage generated at the resistor 121 becomes smaller than that when the switch 134 is on. When the second amplifier 26 does not operate as a pull amplifier, the offset voltage generated at the offset generating circuit 31 rises, and suppresses the current flowing into the second MOSFET 16. On the other hand when the second amplifier 26 operates as a pull amplifier, the offset voltage generated at the offset generating circuit 31 decreases, which reduces the cross-over distortion of the output current waveform. Therefore, the current waveform flowing out from the output terminal 18 changes to the waveform 44 in FIG. 8, and the cross-over distortion becomes smaller as shown by 46.

On the contrary, when an output current flows from the output terminal 118 to the output terminal 18, the MOSFET 115 pushes the output current, and the MOSFET 16 pulls the output current. At the time the comparator 33 outputs a reverse voltage, for instance, a logic "L", which turns the switch 34 OFF and turns the switch 134 ON. The switch 134 comprises a negative logic switch; therefore, the negative logic switch 134 turns on when the comparator 33 outputs the logic "L".

At the time, the both currents from the constant current supplies 136 and 135 flow through the offset resistor 121, therefore the offset voltage generated in the resistor 121 rises higher than that when the switch 134 is off. At this time, because the output of the comparator 33 changes to the logic "L", the positive logic switch 34 turns off. At the time, the current flowing through the offset resistor 21 is only from the constant power supply 36; therefore, the offset voltage generated at the resistor 21 becomes smaller than that when the switch 34 is on. In this case, when the second amplifier 126 does not operate as a pull amplifier, the offset voltage generated at the offset generating circuit 131 rises, and suppresses the invalid current flowing through the second MOSFET 116. When the second amplifier 126 operates as a pull amplifier, the offset voltage generated at the offset generating circuit 131 decreases, which reduces the cross-over distortion of the output current waveform. Accordingly, the current waveform flowing out from the output terminal 118 changes to a waveform 49 in FIG. 8, and the cross-over distortion becomes smaller as shown by a reference number 46.

As explained above, by providing the offset value varying circuits 31 and 131 shown FIG. 10, it is possible tot increase the offset voltage of the second amplifier connected to the output of the amplifier pair on the side which pushes a current, and to decrease the offset voltage of the second amplifier connected to the output of the amplifier pair on the side which pulls a current. This reduces the cross-over distortion.

Embodiment 4

Figure 11:
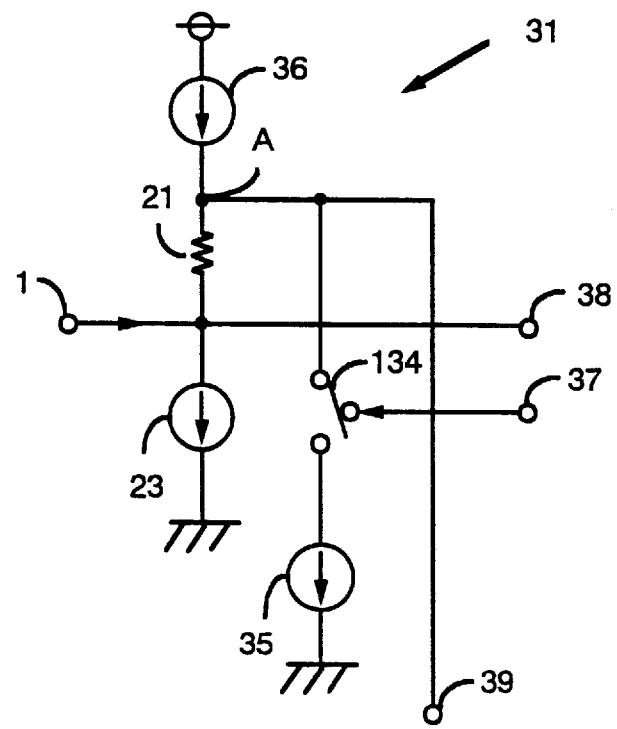
FIG. 11 shows one example of an amplifying circuit according to a fourth embodiment of the present invention.

FIG. 11 shows another embodiment of the variable offset voltage generating circuit 31 of FIG. 10. In FIG. 11, one end of the offset resistor 21 (point A) is connected to a power supply via constant current supply 36, and to the terminal 39. The other end of the offset resistor 21 is connected to the input signal terminal 1, the constant current supply 23 and the terminal 38. The point A is connected to one end of the constant current supply 35 via a negative logic switch 134, and the other end of the constant current supply 35 is grounded. When the comparator 33 outputs, for example, a logic "H", the negative logic switch 134 turns off, the current being shunted from the constant current supply 36 to the constant current supply 35 disappears. Therefore the electric potential of the point A rises. When the output voltage of the comparator 33 changes to the logic "L", the negative switch 134 turns on, and the current of the constant current supply 36 shunts through the offset resistor 21 and through the constant current supply 35. Thus the current flowing through the offset resistor 21 becomes smaller, and the electric potential of the point A lowers. The operation thereafter is the same as that explained in the third embodiment above.

Embodiment 5

Figure 12:
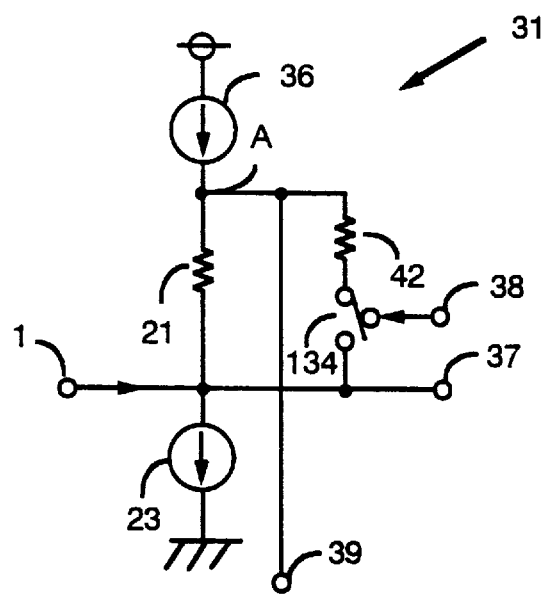
FIG. 12 shows one example of an amplifying circuit according to a fifth embodiment of the present invention.
Figure 13:
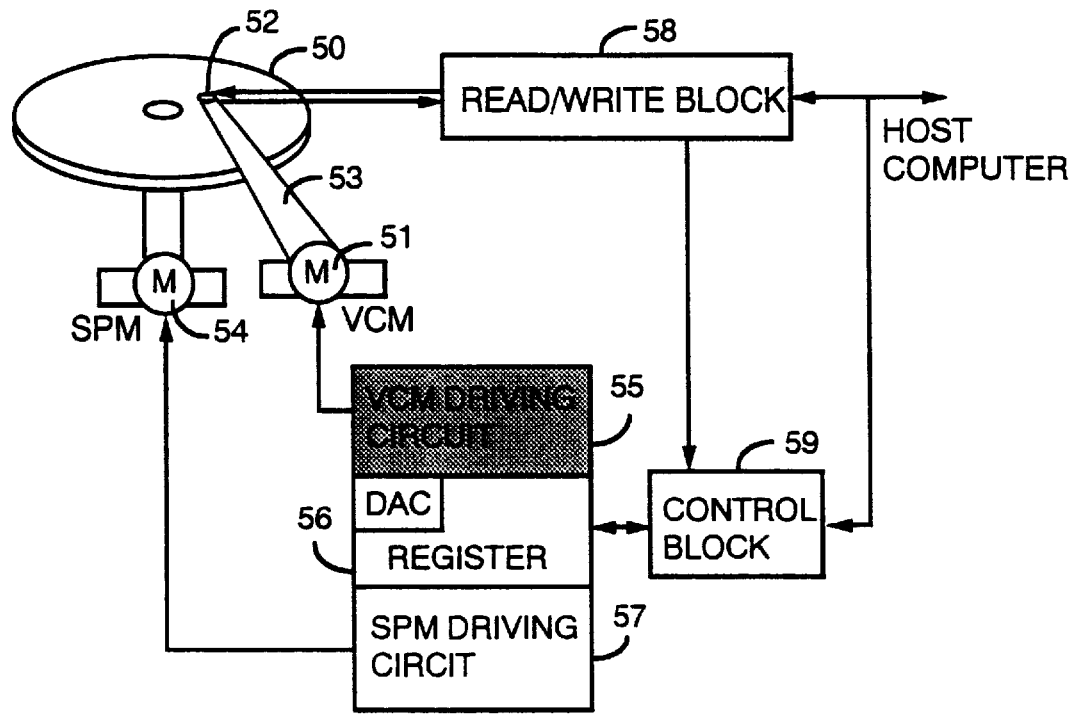
FIG. 13 shows an overall construction of a conventional hard disk system.
Figure 14:
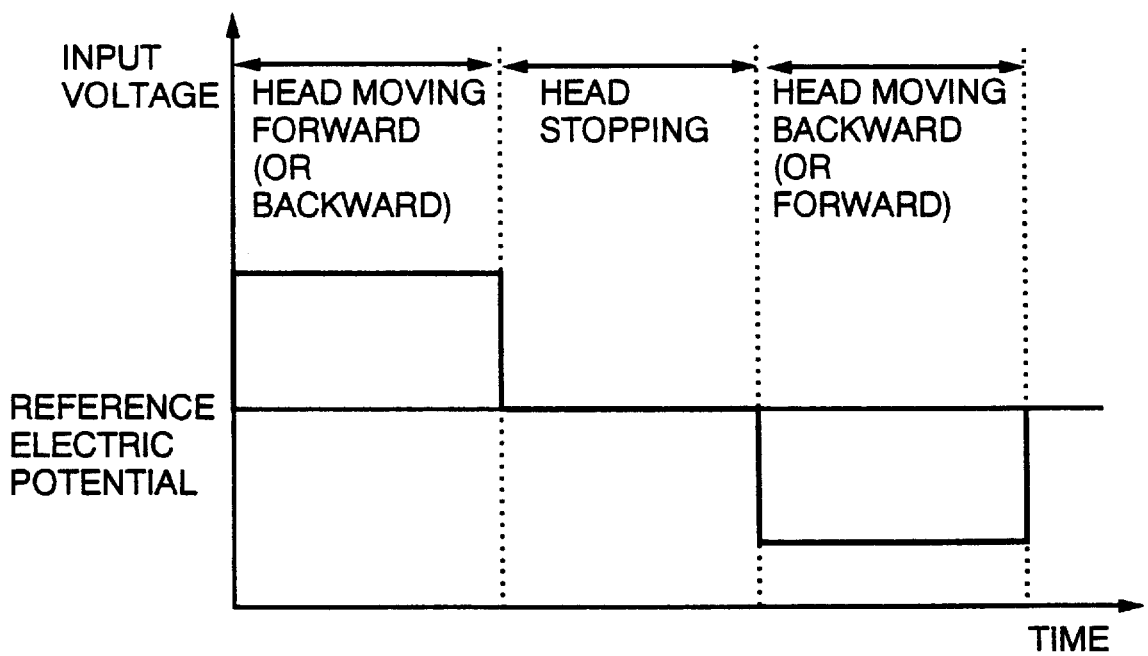
FIG. 14 shows a waveform of the driving voltage inputted into a conventional amplifying circuit.

FIG. 12 shows further embodiment of the variable offset voltage generating circuit 31 of FIG. 10. In FIG. 12, one end of the offset resistor 21 (point A) is connected to a power supply via the constant current supply 36, and to the terminal 39. The other end of the offset resistor 21 is connected to the input signal terminal 1, the constant current supply 23 and the terminal 38, and the other end of the constant current supply 23 is grounded. The point A is connected to the other end (on the side of the terminal 37) of the offset resistor 21 via the resistor 42 and the negative logic switch 134. The negative logic switch 134 turns off when the output voltage of the comparator 33 changes to the logic "H", and the electric potential at the point Arises. When the output voltage of the comparator 33 changes to the logic "L", the negative logic switch 134 turns on, and the current of the constant current supply 36 shunts to the offset resistor 21 and to the resistor 42. Thus the current flowing through the offset resistor 21 becomes smaller, and the electric potential of the point A lowers. The operation thereafter is the same as that explained in the above third embodiment.

What is claimed is:

1. An amplifying circuit comprising:
   a first amplifier having a first input terminal, a second input terminal, an operational amplifier, and an output terminal for pushing an output current;
   a second amplifier having a first input terminal, a second input terminal, an operational amplifier, and an output terminal for pulling an output current;
   a circuit for detecting an output current of the operational amplifier of the second amplifier; and
   an offset voltage generating circuit for generating an offset voltage wherein the offset voltage is applied between the first input terminal of the first amplifier and the first input terminal of the second amplifier, the first input terminal of the first amplifier is connected to a first input signal terminal, the second input terminal of the first amplifier and the second input terminal of the second amplifier are connected to a second input signal terminal, and the output terminal of the first amplifier and the output terminal of the second amplifier are connected to each other at a connecting point, and the amplifying circuit supplies an output current from the connecting point.

2. The amplifying circuit according to 1, further comprising:
   a resistor connected in series with a load to produce a voltage drop responsive to the output current;
   a comparator for detecting the voltage drop and producing an output;
   a first output value varying circuit coupled to the offset voltage generating circuit of the first amplifying circuit and including a first switch for changing an offset voltage supplied to the second amplifier of the first amplifying circuit according to the output of the comparator; and
   a second offset value varying circuit coupled to the offset voltage generating circuit of the second amplifying circuit and including a second switch for changing an offset voltage supplied to the second amplifier of the second amplifying circuit.

3. The amplifying circuit according to claim 2, wherein the first switch for changing the offset voltage of the first amplifying circuit and the second switch for changing the offset voltage of the second amplifying circuit have complementary operations.

4. The amplifying circuit according to claim 1, wherein the operational amplifier of the first amplifier comprises an inverting input terminal, a non-inverting input terminal connected to the first input terminal, and an output terminal, and the first amplifier comprises an MOSFET having a drain connected to a power supply, a source connected to the connecting point, and a gate connected to the output terminal of
   the operational amplifier of the first amplifier, the operational amplifier of the second amplifier comprises an inverting input terminal, a non-inverting input terminal connected to the second input terminal via a resistor, and an output terminal, and the second amplifier comprises an MOSFET having a drain connected to the connecting point, a source connected to ground, and a gate connected to the output terminal of the operational amplifier of the first amplifier,
   the circuit for detecting an output current comprises a first resistor having a first end connected to the gate of the MOSFET of the second amplifier and a second end connected to the output terminal of the operational amplifier of the second amplifier, a second resistor connected between the second end of the first resistor and the inverting input terminal of the operational amplifier of the second amplifier, and a third resistor connected between the first end of the first resistor and ground, and
   the offset voltage generating circuit comprises a first constant current supply, a second constant current supply, a fourth resistor having a first end connected to the first constant current supply, the first input terminal, and the inverting input terminal of the operational amplifier of the second amplifier, the fourth resistor having a second end connected to the non-inverting input terminal of the operational amplifier of the first amplifier, the second constant current supply having a first terminal connected to the second end of the fourth resistor, and a second terminal connected to the ground.

5. An amplifying circuit comprising:
   a first amplifying circuit comprising:
      first and second input terminals;
      an output terminal;
      a first amplifier coupled to the second input terminal, and the output terminal for pushing an output current through a load;
      a second amplifier coupled to the second input terminal and the output terminal for pulling the output current through the load;
      an output current detecting circuit coupled to the second amplifier for detecting a current flowing in the second amplifier; and
      an offset voltage generating circuit coupled to the first input terminal, the first amplifier, the second amplifier, and the output current detecting circuit for generating an offset voltage responsive to the current flowing in the second amplifier;
   a second amplifying circuit comprising:
      first and second input terminals;
      an output terminal;
      a first amplifier coupled to the second input terminal and the output terminal of the second amplifying circuit for pushing the output current through the load;
      a second amplifier coupled to the second input terminal and the output terminal of the second amplifying circuit for pulling the output current through the load;
      an output current detecting circuit coupled to the second amplifier of the second amplifying circuit for detecting a current; and
      an offset voltage generating circuit coupled to the first input terminal, the first amplifier, the second amplifier, and the output current detecting circuit of the second amplifying circuit for generating an offset voltage in response to a current flowing in the second amplifier of the second amplifying circuit,
   wherein the load is connected between the output terminal of the first amplifying circuit and the output terminal of the second amplifying circuit, the first input terminal of the first amplifying circuit is connected to the first input terminal of the second amplifying circuit, and the second input terminal of the first amplifying circuit is connected to the second input terminal of the second amplifying circuit so that the output current flowing through the load is pushed and pulled.

6. The amplifying circuit according to claim 3, wherein the first offset value varying circuit includes a first offset resistor and the second offset value varying circuit includes a second offset resistor,
   a first end of the first offset resistor is connected to a power supply via a first constant current supply, to the power supply via the first switch and a second constant current supply, and to the second amplifier of the first amplifying circuit,
   a second end of the first offset resistor is connected to the first input terminal of the first amplifying circuit, to ground via a third constant current supply, and to the first amplifier of the first amplifying circuit,
   a first end of the second offset resistor is connected to the power supply via a fourth constant current supply, to the power supply via the second switch and a fifth constant current supply, and to the second amplifier of the second amplifying circuit, and
   a second end of the second offset resistor is connected to the first input terminal of the first amplifying circuit, to ground via a sixth constant current supply, and to the first amplifier of the second amplifying circuit.

7. The amplifying circuit according to claim 3, wherein the first offset voltage varying circuit includes a first offset resistor and the second offset value varying circuit includes a second offset resistor, a first end of the first offset resistor is connected to a power supply via a first constant current supply, to ground via the first switch and a second constant current supply, and to the second amplifier of the first amplifying circuit, a second end of the first offset resistor is connected to the first input terminal of the first amplifying circuit, to ground via a third constant current supply, and to the first amplifier of the first amplifying circuit, a first end of the second offset resistor is connected to the power supply via a fourth constant current supply, to ground via the second switch and the second constant current supply, and to the second amplifier of the second amplifying circuit, and a second end of the second offset resistor is connected to the first input terminal of the first amplifying circuit to ground via a fifth constant current supply, and to the first amplifier of the first amplifying circuit.

8. The amplifying circuit according to claim 2, wherein the first offset value varying circuit includes a first offset resistor and the second offset value varying circuit includes a second offset resistor, a first end of the first offset resistor is connected to a power source via a first constant current supply, to a second end of the first resistor via a first resistor and a first switch, and to the second amplifier of the first amplifying circuit, the second end of the first offset resistor is connected to the first input terminal of the first amplifying circuit and to ground via a third constant current source, and to the first amplifier of the first amplifying circuit, a first end of the second offset resistor is connected to the power supply via a fourth constant current supply, to a second end of the second offset resistor via the second switch, and to the second amplifier of the first amplifying circuit, and the second end of the second offset resistor is connected to the first input terminal of the second amplifying circuit and to ground via a sixth constant current supply, and to the first amplifier of the second amplifying circuit.

* * * * *

UNITED STATES PATENT AND TRADEMARK OFFICE
CERTIFICATE OF CORRECTION

PATENT NO. : 5,841,321
DATED : November 24, 1998
INVENTOR(S) : Miyake et al.

It is certified that error appears in the above-identified patent and that said Letters Patent is hereby corrected as shown below:

Claim 2, Line 1, change "1" to --5--;

Claim 5, Line 5, delete ",".

Signed and Sealed this

Fifteenth Day of June, 1999

Attest:

Q. TODD DICKINSON

Attesting Officer  Acting Commissioner of Patents and Trademarks